United States Patent [19]
Drost et al.

[11] Patent Number: 5,963,606
[45] Date of Patent: Oct. 5, 1999

[54] PHASE ERROR CANCELLATION METHOD AND APPARATUS FOR HIGH PERFORMANCE DATA RECOVERY

[75] Inventors: Robert J. Drost, Palo Alto; Robert J. Bosnyak, San Jose, both of Calif.

[73] Assignee: Sun Microsystems, Inc., Palo Alto, Calif.

[21] Appl. No.: 08/884,052

[22] Filed: Jun. 27, 1997

[51] Int. Cl.[6] .................................................. H04L 7/00
[52] U.S. Cl. .......................... 375/371; 370/517; 327/161
[58] Field of Search .................................. 375/342, 355, 375/371, 373, 376, 354; 370/516, 517; 327/141, 155, 156, 158, 161

[56] References Cited

U.S. PATENT DOCUMENTS

| | | | |
|---|---|---|---|
| 4,390,985 | 6/1983 | Fourcade et al. | 370/517 |
| 5,081,655 | 1/1992 | Long | 375/373 |
| 5,374,860 | 12/1994 | Llewellyn | 327/276 |
| 5,463,351 | 10/1995 | Marko et al. | 331/1 A |
| 5,550,860 | 8/1996 | Georgiou et al. | 375/220 |
| 5,594,762 | 1/1997 | Joo et al. | 375/371 |

OTHER PUBLICATIONS

Yang et al., "A 0.8 μm CMOS 2.5Gb/s Oversampled Receiver for Serial Links," 1996 IEEE International Solid-State Circuits Conference, p. 200–201.

Ewen et al., Slngle–Chip 1062Mbaud CMOS Transceiver for Serial Data Communication, 1995 IEEE International Solid-State Circuits Conference, p. 32–33.

Primary Examiner—Temesghen Ghebretinsae
Attorney, Agent, or Firm—Finnegan, Henderson, Farabow, Garrett & Dunner, L.L.P.

[57] ABSTRACT

A phase error cancellation apparatus captures data bits of a serialized data stream with reduced phase error by aligning a generated clock signal to the data stream. The phase error cancellation apparatus includes a data delay pipe, a clock generator, a clock delay pipe, and a data stream sampling element. The data delay pipe receives the data stream and delays the data bits by a first amount. The clock generator generates a clock signal that the clock delay pipe delays by a second amount. The data stream sampling element receives the delayed data bits and the delayed clock signal, and samples the delayed data bits using the delayed clock signal to recover the data bits from the data stream with reduced phase error.

18 Claims, 10 Drawing Sheets

PHASE ERROR CANCELLATION METHOD AND APPARATUS FOR HIGH PERFORMANCE DATA RECOVERY

FIELD OF THE INVENTION

The present invention is directed to a method and apparatus for reducing phase error when recovering bits from a serialized non-return to zero (NRZ) data stream.

BACKGROUND OF THE INVENTION

Systems that do not transmit a clock signal with the data must manufacture a properly synchronized clock from the data to accurately recover data bits from the incoming data stream. Accurate data recovery requires clock generation circuitry in these systems to have low jitter and low phase error relative to the data stream. Phase error greater than 0.5 unit intervals (U.I.), or 500 ps for a 1 Gbps system, causes erroneous data recovery.

Two conventional systems attempt to combat the phase error problem. Ewen et al., "Single-Chip 1062 Mbaud CMOS Transceiver for Serial Data Communication," 1995 International Solid-State Circuits Conference, Digest of Technical Papers, pp. 32-33, describes one system, and Yang et al., "A 0.8 um CMOS 2.5 Gb/s Oversampled Receiver for Serial Links," 1996 International Solid State Circuits Conference, Digest of Technical Papers, pp. 200-201, describes the other.

The first conventional system uses a clock recovery circuit to obtain low phase error. A phase or phase/frequency locked loop determines the underlying clock period in the incoming data stream, and through careful design of the loop's frequency transfer function controls the phase error. Limits in the loop's frequency transfer function due to instability concerns, however, hamper the first system's success in completely eliminating the phase error.

The second conventional system uses a clock generation circuit to obtain low phase error. The clock generation circuit uses a local clock, close in frequency to a harmonic of the incoming data's frequency, to generate a clock signal. Because the local clock is not synchronous to the incoming data, the second system oversamples (typically by 3×) the data, and a decision circuit chooses the appropriate sample.

The second system tries to control phase error through the decision circuit's tracking of phase shifts between the local clock and the data stream. Because the decision circuit can only choose from among available samples, and the actual correct sampling point may lie between two of the samples taken, this system suffers severe limitations. For 3× oversampling, this possibly introduces up to 0.16 U.I. of phase error, a value that requires higher sampling rates to reduce. Higher sampling rates may not be feasible, however, due to area, power, and bandwidth concerns. Additionally, the digital phase tracking mechanism has a low bandwidth, thus causing situations where the phase error may be greater than 0.5 U.I.

In both of the conventional systems described above, the phase error remains large enough to be a significant component of the overall data bit recovery error rate due to the systems' inability to sufficiently align the generated clock to the data stream. Therefore, a need exists to reduce this phase error.

SUMMARY OF THE INVENTION

Systems and methods consistent with the principles of the present invention cancel more of the remaining phase error and accurately recover the data bits by aligning the generated clock to the data stream.

In accordance with the purpose of the invention as embodied and broadly described herein, the present invention includes a phase error cancellation apparatus that captures data bits of a serialized data stream with reduced phase error by aligning a generated clock signal to the data stream. The apparatus includes a data delay pipe, a clock generator, a clock delay pipe, and a data stream sampling element.

The data delay pipe receives the data stream and delays the data bits by a first amount. The clock generator generates a clock signal that the clock delay pipe delays by a second amount. The data stream sampling element receives the delayed data bits and the delayed clock signal, and samples the delayed data bits using the delayed clock signal to recover the data bits from the data stream with reduced phase error.

BRIEF DESCRIPTION OF THE DRAWINGS

The accompanying drawings, which are incorporated in and constitute a part of this specification, illustrate an embodiment of the invention and, together with the description, serve to explain the objects, advantages and principles of the invention. In the drawings.

DETAILED DESCRIPTION OF THE PREFERRED EMBODIMENTS

The following detailed description of the invention refers to the accompanying drawings. While the description includes exemplary embodiments, other embodiments are possible, and changes may be made to the embodiments described without departing from the spirit and scope of the invention. The following detailed description does not limit the invention. Instead, the scope of the invention is defined only by the appended claims.

The phase error cancellation apparatus consistent with the principles of the present invention aligns a generated clock signal to an incoming data stream to recover the data bits from the data stream with reduced phase error.

I. System.

Figure 1:
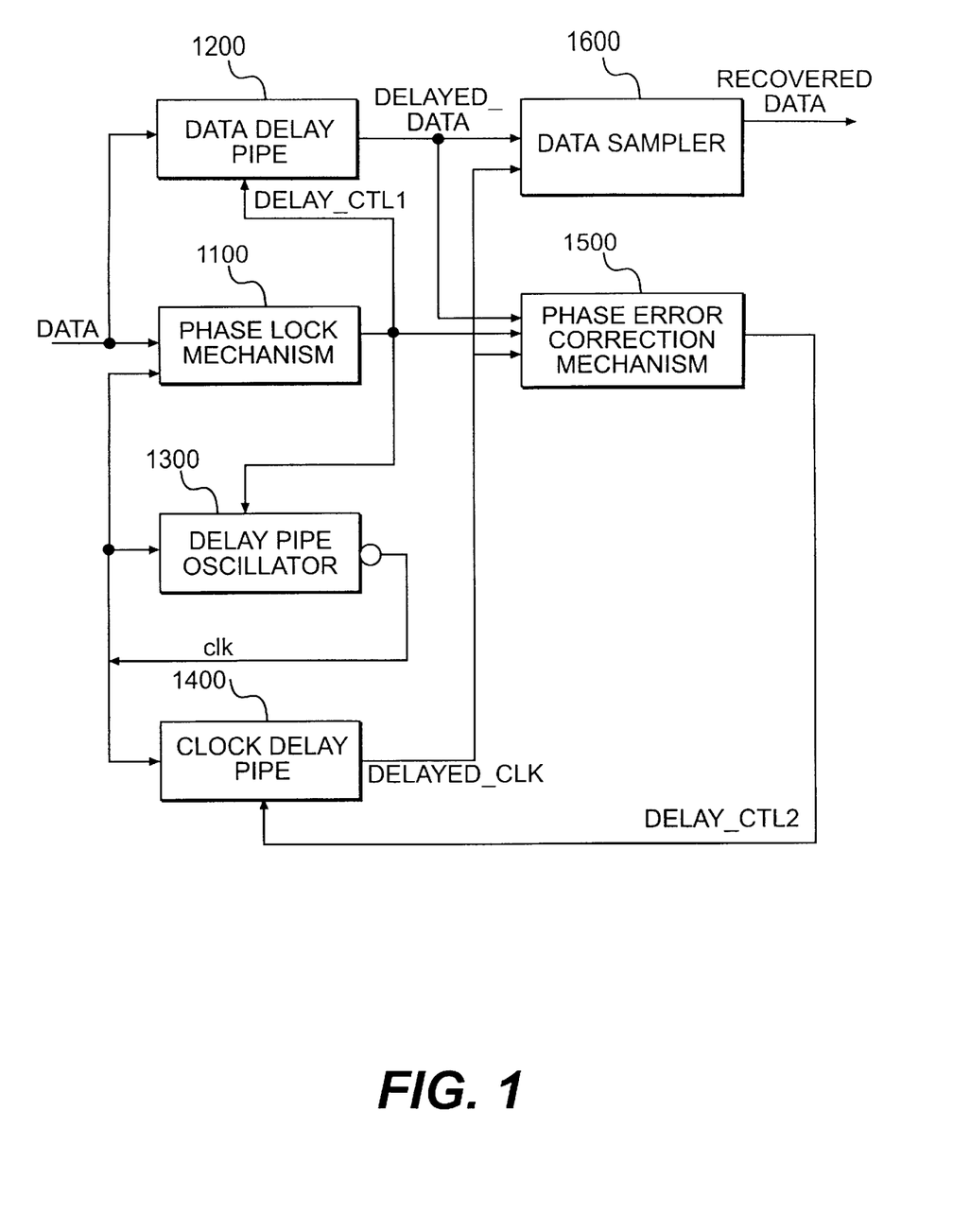
FIG. 1 is a block diagram of a phase error cancellation apparatus consistent with the principles of the present invention.

FIG. 1 is a block diagram of the phase error cancellation apparatus consistent with the principles of the present invention. The phase error cancellation apparatus includes phase lock mechanism 1100, data delay pipe 1200, delay pipe oscillator 1300, clock delay pipe 1400, phase error correction mechanism 1500, and data sampler 1600. While FIG. 1 shows the data and clock signals being transmitted on single data and clock lines, respectively, in an implementation consistent with the principles of the present invention the data and clock signals are transmitted on dual, differential and complementary signal lines.

Phase lock mechanism 1100 in conjunction with delay pipe oscillator 1300 form a phase lock loop. Phase lock mechanism 1100 receives the input data stream and a clock (clk) signal generated by delay pipe oscillator 1300 and performs lower bandwidth tracking in an attempt to align the data stream to the clock signal. Phase lock mechanism 1100 outputs a delay control signal, delay_ctl1, that directly controls the delay occurring in data delay pipe 1200 and delay pipe oscillator 1300, and indirectly controls the delay occurring in clock delay pipe 1400.

Figure 2:
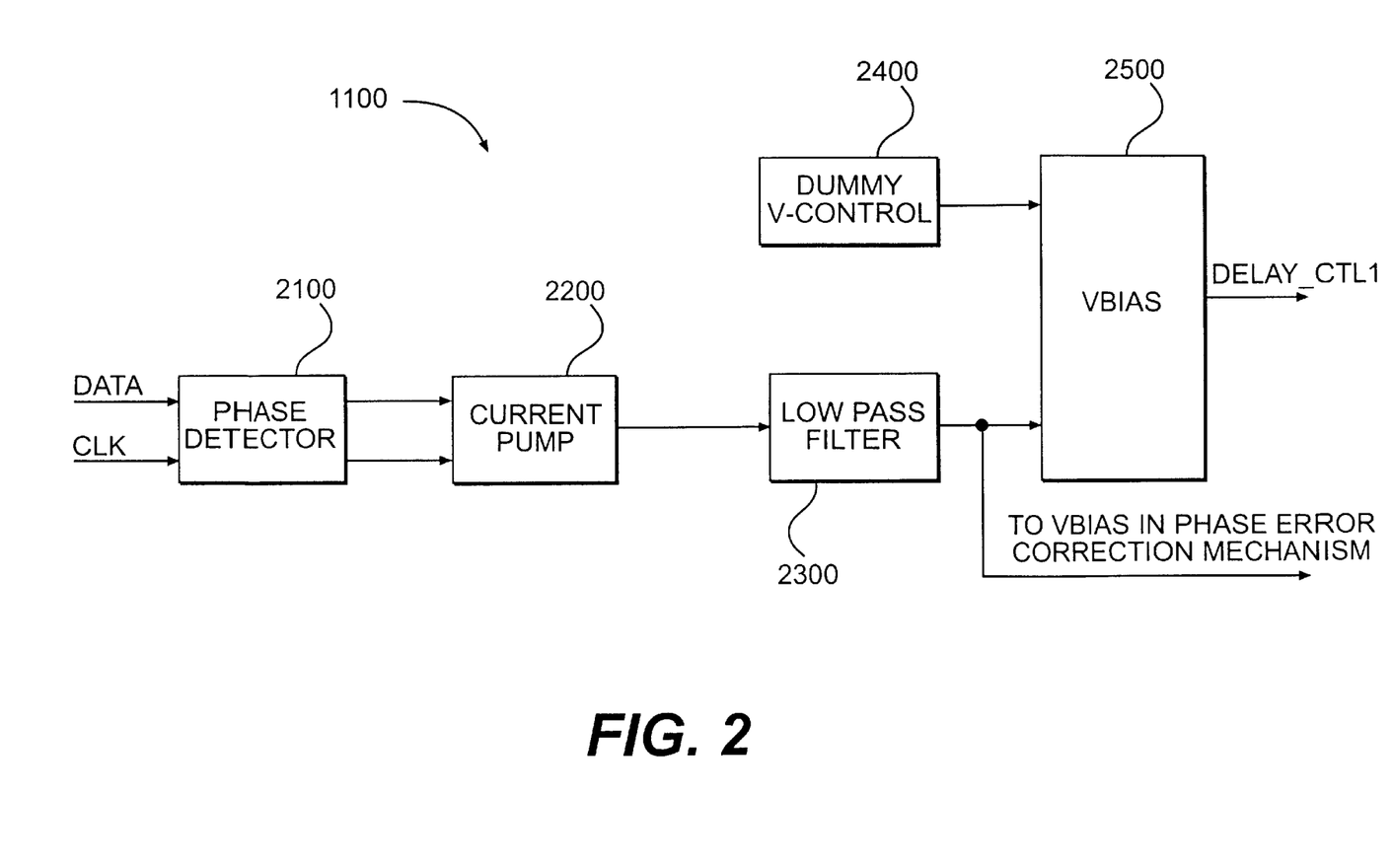
FIG. 2 is a block diagram of elements of the phase lock mechanism of FIG. 1.

FIG. 2 is a block diagram of the elements of phase lock mechanism 1100, including phase detector 2100, current pump 2200, low pass filter 2300, dummy v-control 2400, and vbias 2500. Phase detector 2100 is a conventional phase difference detector, such as a Hogge phase detector. Phase detector 2100 receives the input data stream and the clk signal generated by delay pipe oscillator 1300, and outputs two signals which together indicate the difference in phase between the data of the input data stream and the clk signal.

Current pump 2200 is a conventional differential current steering device. Current pump 2200 receives the two output signals from phase detector 2100, and steers them into the output. Low pass filter 2300 is preferably a series RC low pass filter. Low pass filter 2300 receives the output from current pump 2200, and outputs a voltage signal. Dummy v-control 2400 provides a constant output signal to vbias 2500.

Figure 3:
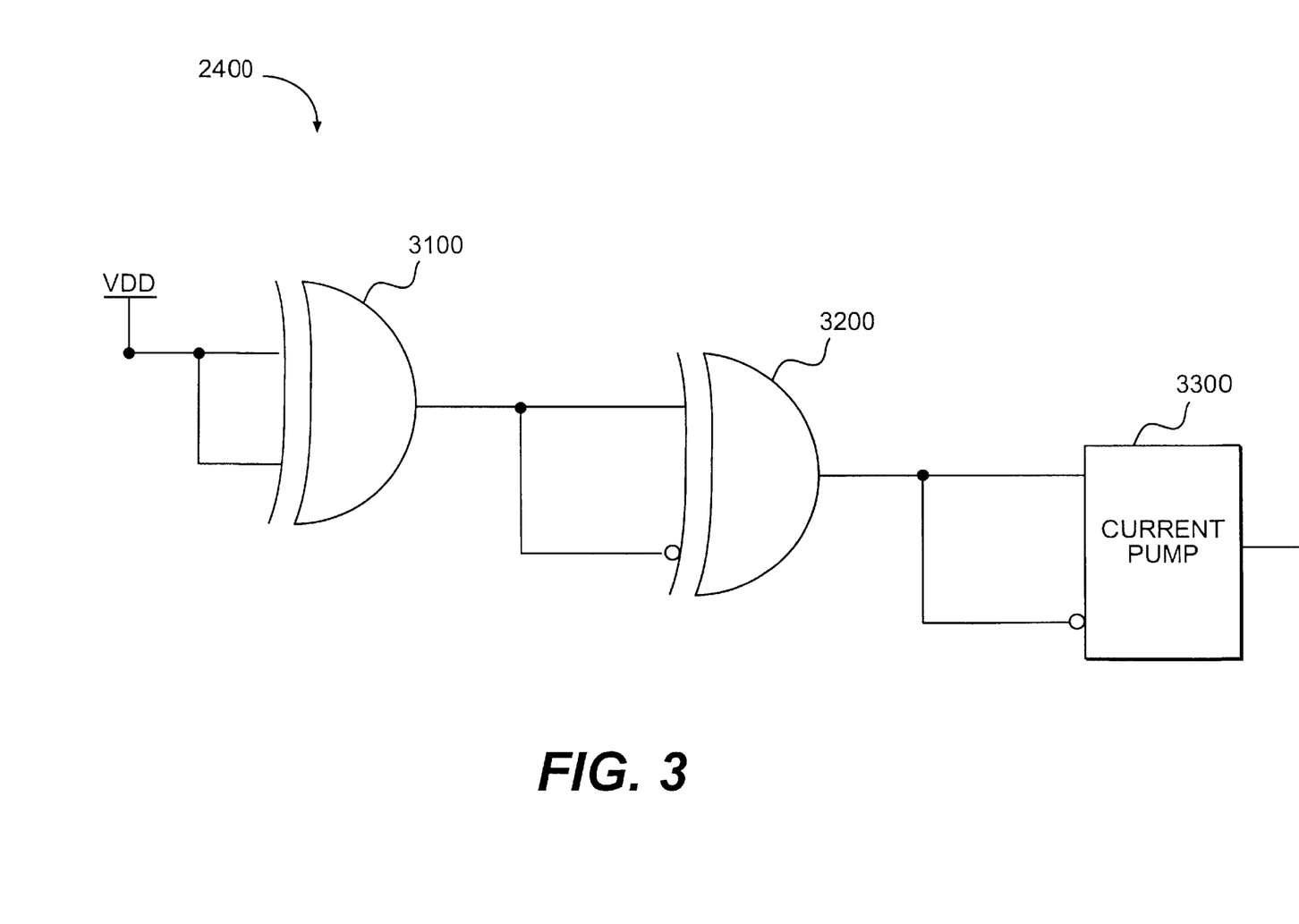
FIG. 3 is a block diagram of the dummy v-control of FIG. 2.

FIG. 3 is a block diagram of the elements of dummy v-control 2400, including exclusive ORs (XORs) 3100 and 3200, and a conventional current pump 3300. XOR 3100 receives a high voltage signal (Vdd) at both of its inputs. This causes XOR 3100 to output a low signal to XOR 3200. XOR 3200 receives complementary signals at its inputs, since one of the inputs is inverted, and outputs a high signal to current pump 3300. XORs 3100 and 3200 are used to ensure correct high and low logic levels because the signals may not necessarily be Vdd or ground (Gnd).

Current pump 3300 also receives complementary signals at its inputs, since one of the inputs is inverted, and steers them into an output signal to vbias 2500 (FIG. 2). Current pump 3300 is used to obtain the correct zero input level of the signal.

Vbias 2500 is a conventional device for adding currents together based on the level of input voltage signals. Vbias 2500 receives the output of dummy v-control 2400 and the output of low pass filter 2300, and generates the delay_ctl1 signal used to control the delay of data delay pipe 1200 and delay pipe oscillator 1300. By controlling the delay of delay pipe oscillator 1300, vbias 2500 sets the frequency of the clk signal. By controlling the delay of data delay pipe 1200, vbias 2500 delays the data of the data stream by a time proportional to the frequency of the clk signal.

Figure 4A:
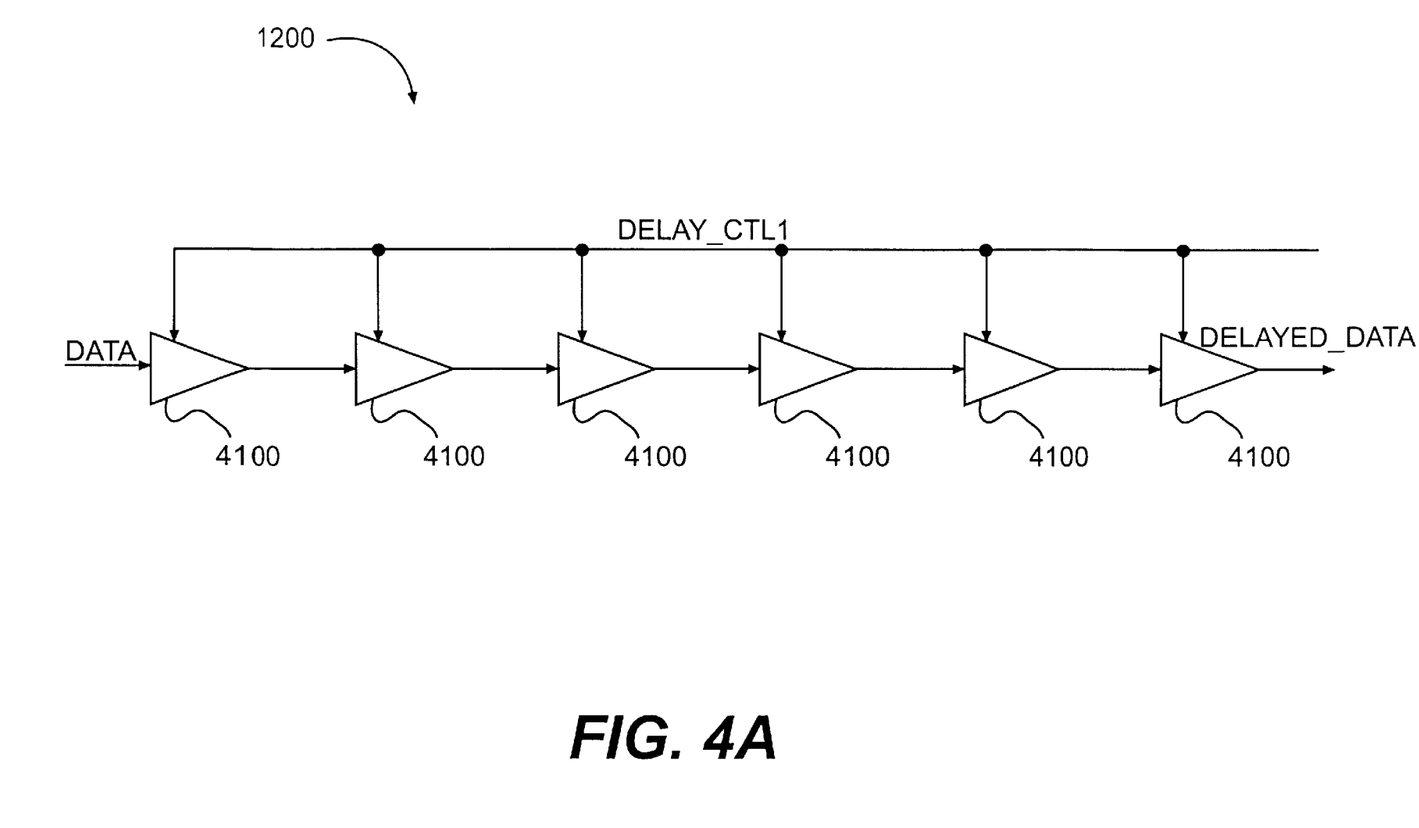
FIG. 4A is a block diagram of elements of the data delay pipe of FIG. 1.

Returning to FIG. 1, data delay pipe 1200 receives the input data stream and the delay_ctl1 signal from phase lock mechanism 1100 and outputs a delayed_data signal. The delayed_data signal represents the input data stream delayed by an amount determined by the delay_ctl1 signal. Data delay pipe 1200 delays the input data stream in an attempt to synchronize the data of the data stream with a delayed clock (delayed_clk) signal output from clock delay pipe 1400 (described below). FIG. 4A is a block diagram of the elements of data delay pipe 1200, including a series of delay stages 4100. Each of the delay stages 4100 contains, for example, a buffer element. While FIG. 4A shows six delay stages comprising data delay pipe 1200, a larger or smaller number of delay stages could be used.

Figure 4B:
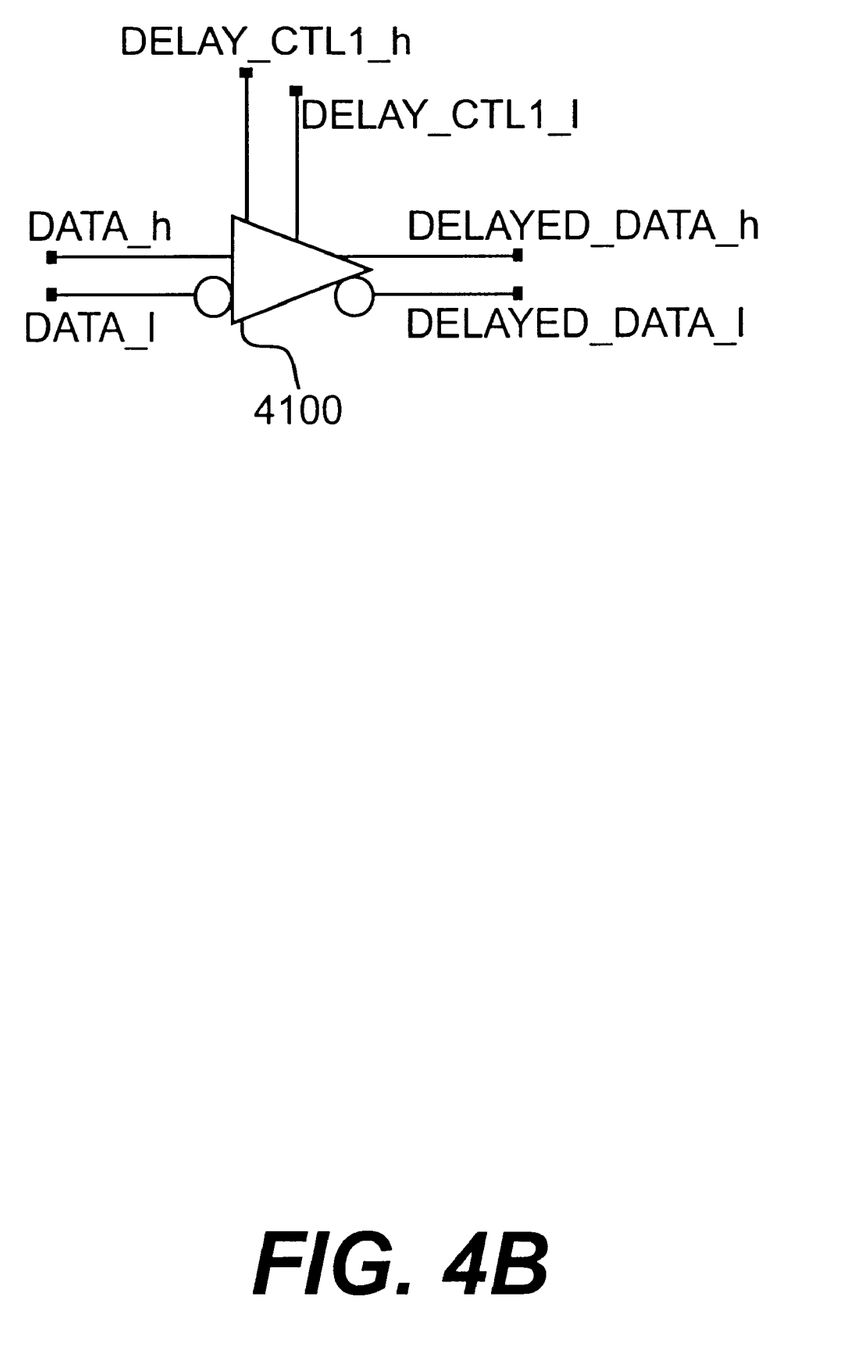
FIG. 4B is a block diagram of a delay stage of FIG. 4A with dual, differential and complementary inputs and outputs.

FIG. 4B is a block diagram of delay stage 4100 with dual, differential and complementary inputs and outputs. Delay stage 4100 receives high and low data input signals (data_h and data_l, respectively). The data_h and data_l signals are either the data from the input data stream or delayed data from a previous delay stage, depending upon the location of delay stage 4100 within data delay pipe 1200. The delay_ctl1 signal, represented by complementary signals delay_ctl1_h and delay_ctl1_l, controls the propagation delay through delay stage 4100. Delay stage 4100 outputs delayed data as complementary signals delayed_data_h and delayed_data_l.

Figure 4C:
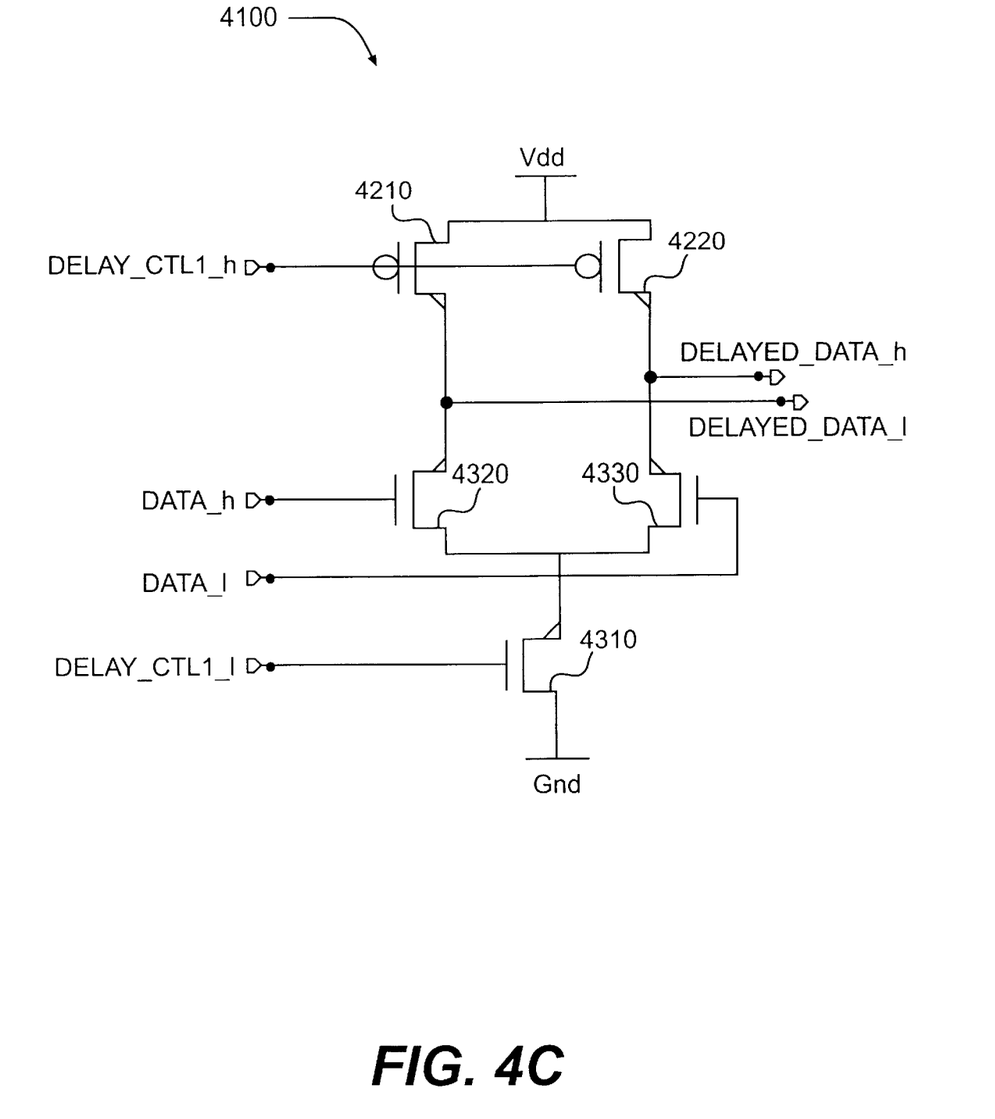
FIG. 4C is a schematic diagram of the delay stage of FIG. 4B.

FIG. 4C is a schematic diagram of delay stage 4100 of FIG. 4B. Delay stage 4100 includes p-type transistors 4210 and 4220 and n-type transistors 4310, 4320, and 4330. P-type transistors 4210 and 4220 receive the delay_ctl1_h signal at their gates, and n-type transistor 4310 receives the delay_ctl1_l signal at its gate. N-type transistors 4320 and 4330, on the other hand, receive the data_h and data_l signals, respectively, at their gates. Delayed_data_h and delayed_data_l are output from points connecting p-type transistor 4210 to n-type transistor 4320 and p-type transistor 4220 to n-type transistor 4330, respectively.

Figure 5:
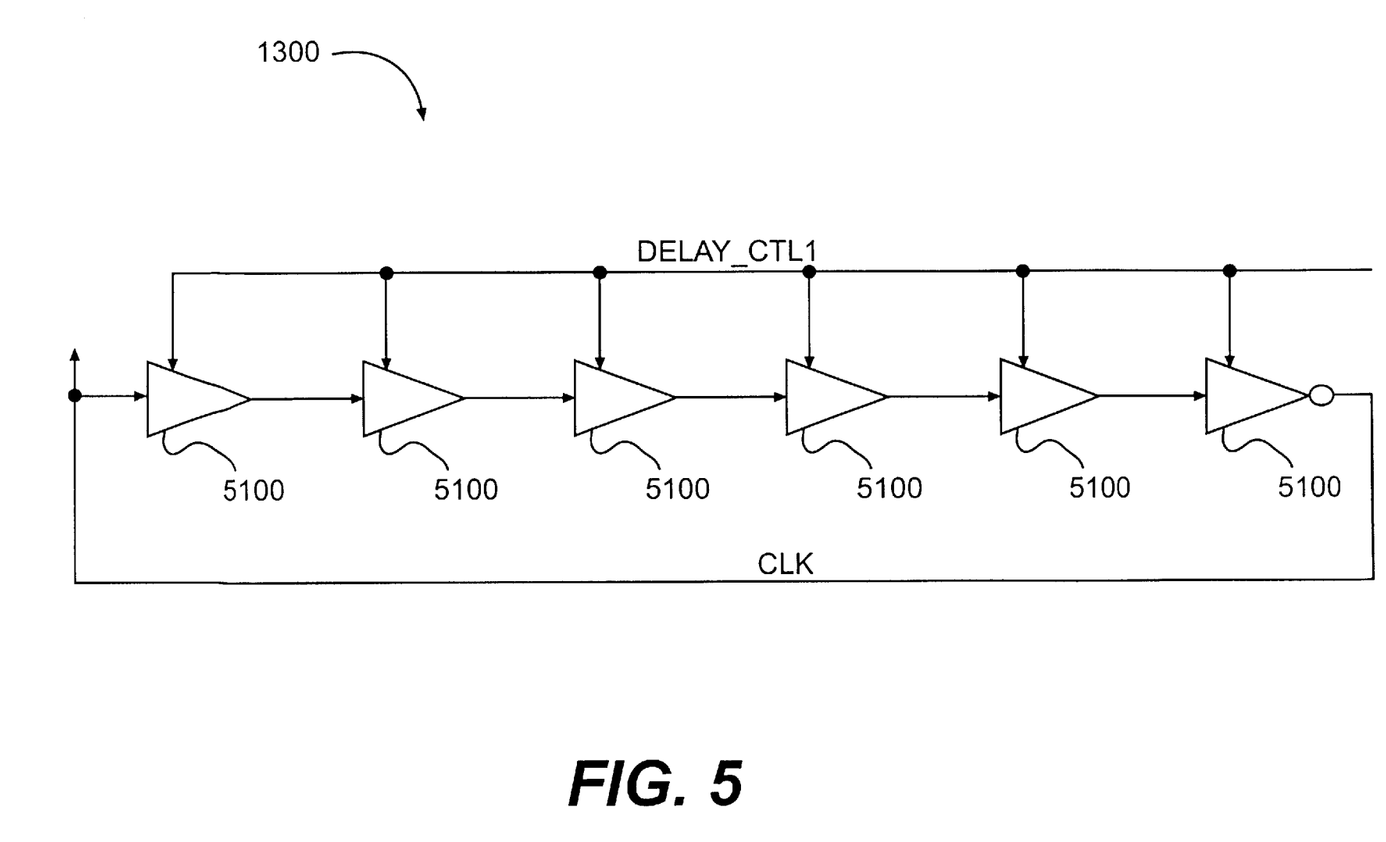
FIG. 5 is a block diagram of elements of the delay pipe oscillator of FIG. 1.

Returning to FIG. 1, delay pipe oscillator 1300 generates the clk signal input to phase lock mechanism 1100 and clock delay pipe 1400 based on the delay_ctl1 signal from phase lock mechanism 1100. FIG. 5 is a block diagram of the elements of delay pipe oscillator 1300. Delay pipe oscillator 1300 contains buffer elements matched to both data delay pipe 1200 and clock delay pipe 1400, but may contain a different number of delay stages 5100. The output of delay pipe oscillator 1300 feeds back to its input, forming a voltage, or current, controlled oscillator. As described above, delay pipe oscillator 1300 operates in conjunction with phase lock mechanism 1100 to form a conventional phase lock loop.

Figure 6:
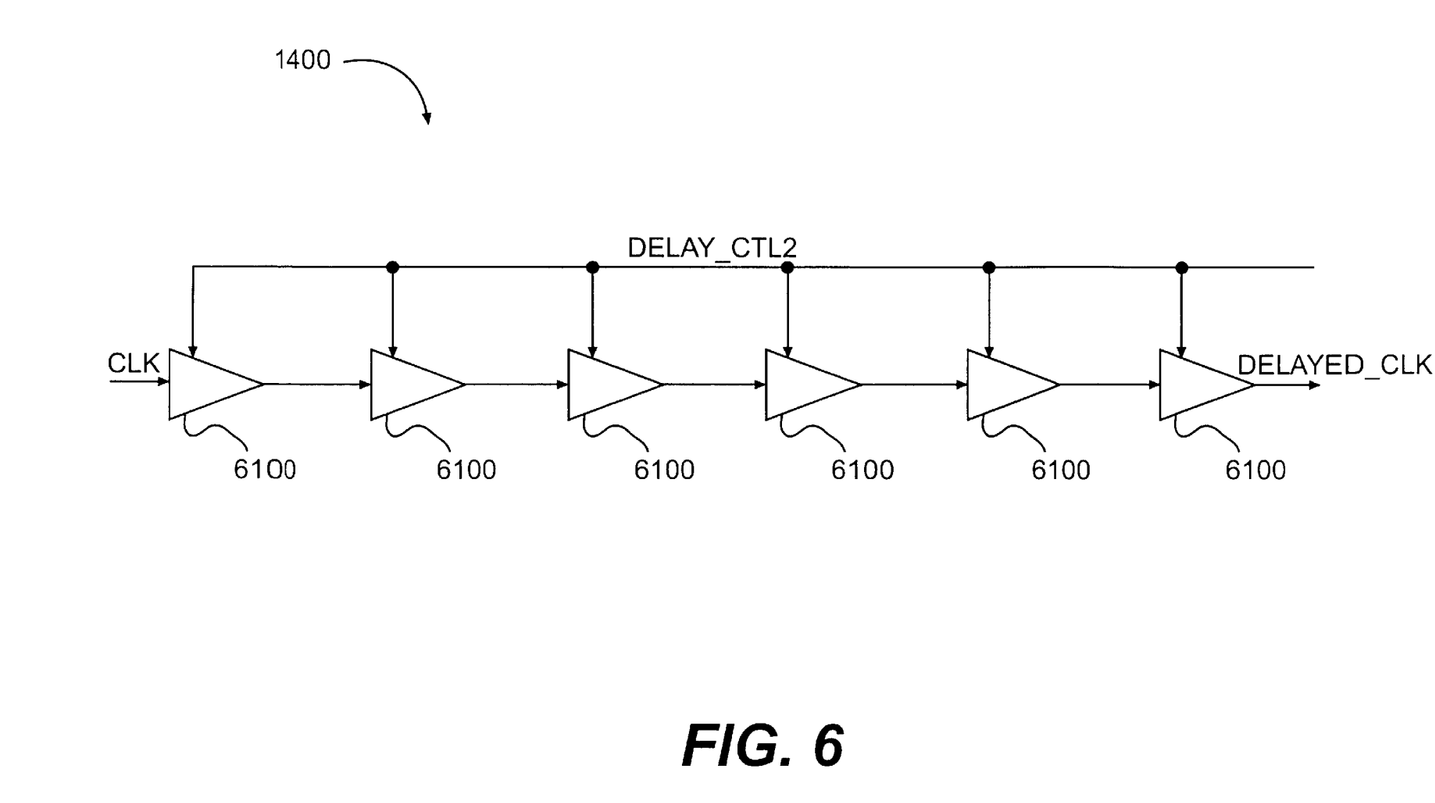
FIG. 6 is a block diagram of elements of the clock delay pipe of FIG. 1.

Clock delay pipe 1400 receives the clk signal from delay pipe oscillator 1300 and a delay control (delay_ctl2) signal from phase error correction mechanism 1500, and generates a delayed clock (delayed_clk) signal. FIG. 6 is a block diagram of the elements of clock delay pipe 1400, including delay stages 6100 matched to both data delay pipe 1200 and delay pipe oscillator 1300. Clock delay pipe 1400 contains the same number of delay stages as data delay pipe 1200 to replicate the delays occurring in data delay pipe 1200 and delay pipe oscillator 1300, but additionally adds or subtracts some delay amount as determined by phase error correction mechanism 1500 to reduce the phase error between the delayed_clk and delayed_data signals.

Phase error correction mechanism 1500 is a delay locking mechanism, as opposed to phase lock mechanism 1100 which is a phase locking mechanism, that performs higher bandwidth tracking and avoids jitter peaking that is common to phase lock loops. Phase error correction mechanism 1500 receives the delayed_data signal from data delay pipe 1200, the delayed_clk signal from clock delay pipe 1400, and the delay_ctl1 signal from phase lock mechanism 1100, and compares the delayed_data signal to the delayed_clk signal. Based on this comparison, phase error correction mechanism 1500 generates the delay_ctl2 signal which controls clock delay pipe 1400 to shift the delayed_clk signal by the correct amount to align it with the delayed_data signal.

Figure 7:
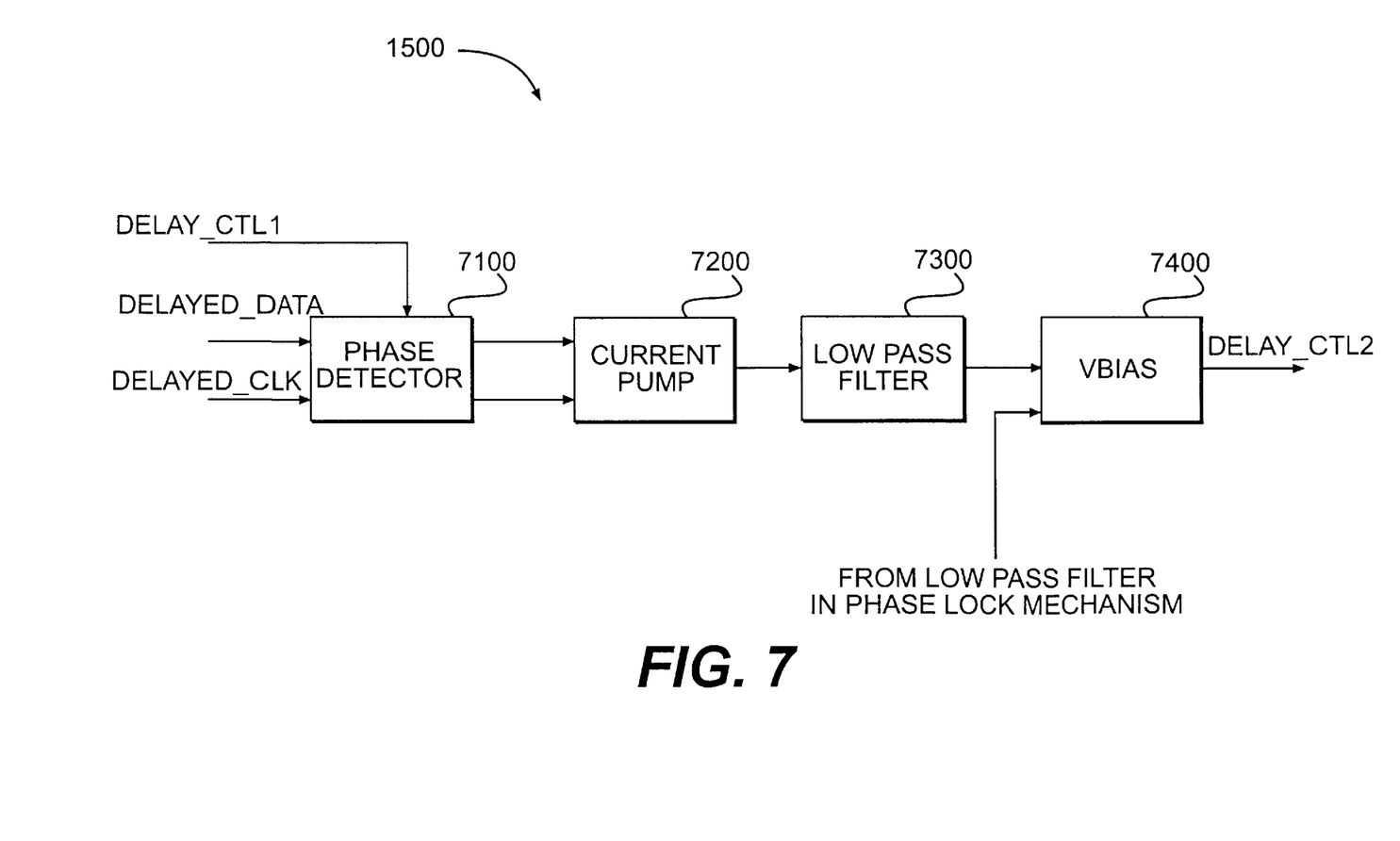
FIG. 7 is a block diagram of elements of the phase error correction mechanism of FIG. 1.

FIG. 7 is a block diagram of the elements of phase error correction mechanism 1500, including phase detector 7100, current pump 7200, low pass filter 7300, and vbias 7400. These elements are similar to the corresponding elements described with reference to FIG. 2.

Phase detector 7100 receives the delayed_data signal from data delay pipe 1200 and the delayed_clk signal from clock delay pipe 1400, and outputs two signals which together indicate the difference in phase between the delayed_data and the delayed_clk signals. Current pump 7200 receives the two output signals from phase detector 7100, and steers them into the output. Low pass filter 7300 is preferably a capacitor low pass filter. Low pass filter 7300 receives the output from current pump 7200, and outputs a voltage signal.

Vbias 7400 receives the output from low pass filter 7300 and the output from low pass filter 2300 of phase lock mechanism 1100, and generates the delay_ctl2 signal therefrom. The delay_ctl2 signal controls the delay of clock delay pipe 1400 to add or subtract some delay amount so as to reduce the phase error between the delayed_clk and delayed_data signals.

Returning to FIG. 1, data sampler 1600 is a conventional latch, such as a flip-flop. Data sampler 1600 receives the delayed_data signal from data delay pipe 1200 and the delayed_clk signal from clock delay pipe 1400 and uses the delayed_clk signal to sample and latch the delayed_data signal with minimal phase error, thereby producing the recovered data signal.

II. Processing.

Figure 8:
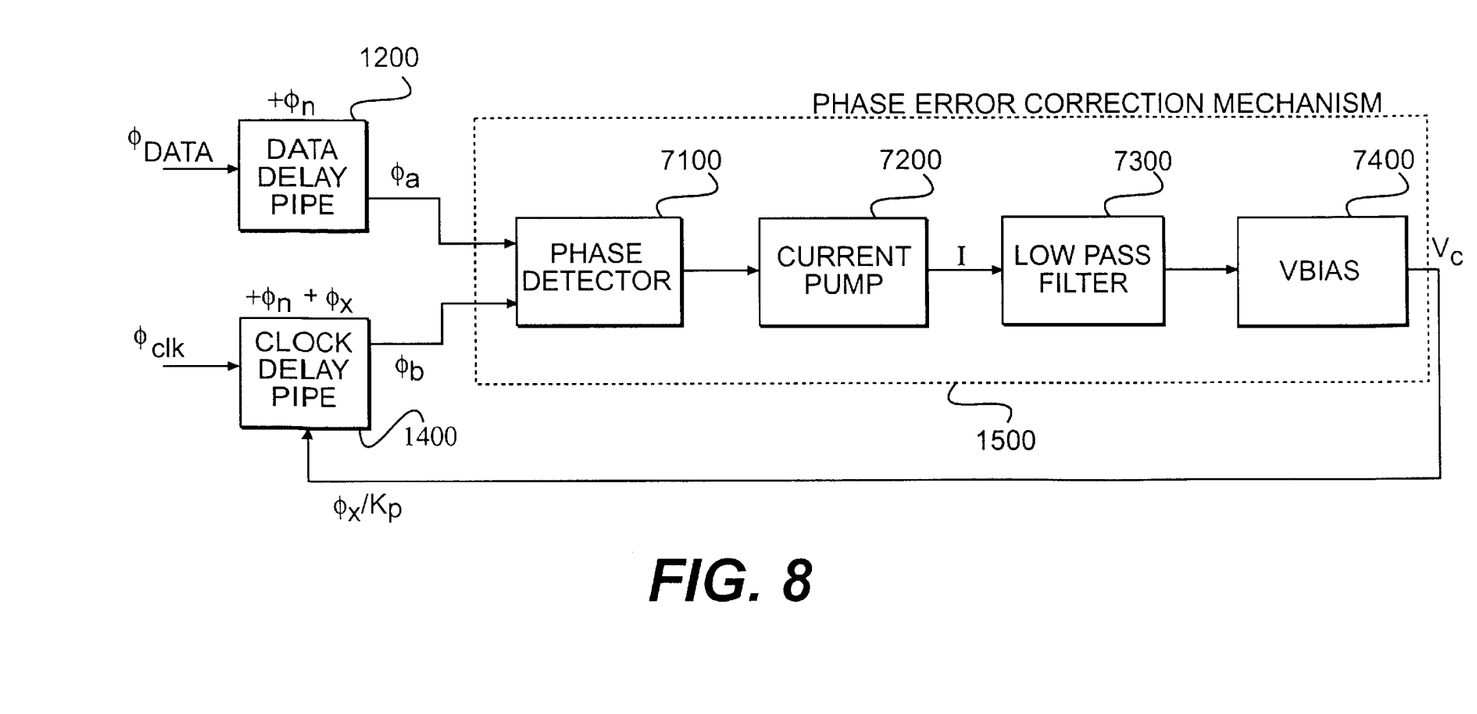
FIG. 8 is a block diagram showing an example of the operation of the phase error cancellation apparatus consistent with the principles of the present invention.

The operation of the phase error cancellation apparatus consistent with the principles of the present invention will be described by the following example with reference to FIG. 8. Since data delay pipe 1200 and clock delay pipe 1400 are matched circuits, the effect of the delay_ctl1 signal on them is to produce a delay Øn. However, clock delay pipe 1400 actually receives the delay_ctl2 signal, which is equal to the delay_ctl1 signal plus or minus the correction term produced by phase error correction mechanism 1500. Thus, the delayed_clk signal receives an additional delay of Øx.

Data delay pipe 1200 receives the input data stream having a phase of Ødata. The delayed_data signal output from data delay pipe 1200 has a phase of $$Øa = Ødata + Øn \tag{1}$$

Clock delay pipe 1400, on the other hand, receives the clock signal having a phase of Øclk. The delayed_clk signal output from clock delay pipe 1400 has a phase of $$Øb = Øclk + Øn + Øx \tag{2}$$

Phase detector 7100 detects the difference in phase between Øa and Øb, and outputs a signal indicative of the phase difference to current pump 7200. Current pump 7200 outputs a current signal, $$I = K_D(Øa - Øb) \tag{3}$$
$$= K_D(Ødata + Øn - Øclk - Øn - Øx)$$
$$= K_D(Ødata - Øclk - Øx)$$

where $K_D$ represents the gain of phase detector 7100, to low pass filter 7300. Low pass filter 7300 outputs a voltage signal to vbias 7400. Vbias 7400 generates delay_ctl2 having a voltage $$Vc = I/SC \tag{4}$$
$$= (K_D/SC)(Ødata - Øclk - Øx)$$

where SC is the frequency domain representation of the capacitance of low pass filter 7300, and $$Øx = KpVc \tag{5}$$
$$= (KpK_D/SC)(Ødata - Øclk - Øx)$$
$$= ((KpK_D/SC)/(1 + (KpK_D/SC)))(Ødata - Øclk)$$
$$= (1/(1 + (SC/KpK_D)))(Ødata - Øclk)$$

where Kp represents the combined gain of vbias 7400 and clock delay pipe 1400.

The phase error, Øerror, is calculated by $$Øerror = Øa - Øb \tag{6}$$
$$= Ødata - Øclk - Øx$$
$$= (Ødata - Øclk)(1 - (1/(1 + (SC/KpK_D))))$$
$$= F(Ødata - Øclk)$$

where $$F = (SC/KpK_D)/(1+(SC/KpK_D)) \tag{7}$$

The term F indicates the amount of phase error reduction caused by the phase error cancellation apparatus consistent with the principles of the present invention. The term F is zero at zero frequency (i.e., direct current), and increases at 20 dB/dec up to the bandwidth of the phase error cancellation apparatus, (KpK_D/C), where it levels off at one. This result indicates that the phase error cancellation apparatus does not amplify the phase error. In contrast, in phase locked loops the term analogous to F will have a magnitude greater than one over some frequency interval.

The phase error cancellation apparatus consistent with the principles of the present invention permits accurate recovery of an input data stream by reducing phase error between a sampling clock signal and the input data stream.

The foregoing description of preferred embodiments of the present invention provides illustration and description, but is not intended to be exhaustive or to limit the invention to the precise form disclosed. Modifications and variations are possible in light of the above teachings or may be acquired from practice of the invention. The scope of the invention is defined by the claims and their equivalents.

What is claimed is:

1. An apparatus to recover data bits from a data stream with reduced phase error, comprising:

a data delay pipe coupled to receive the data stream, and configured to delay the data bits by a first amount;

a phase lock mechanism coupled to the data delay pipe, and configured to control the data delay pipe to delay the data bits by the first amount;

a clock generator configured to generate a clock signal;

a clock delay pipe coupled to the clock generator, and configured to delay the clock signal by a second amount; and a data stream sampling element coupled to receive the delayed data bits and the delayed clock signal, and configured to sample the delayed data bits using the delayed clock signal to recover the data bits from the data stream with reduced phase error.

2. The apparatus of claim 1, wherein the phase lock mechanism includes a phase detector coupled to receive the data stream and the clock signal, and configured to detect a difference in phase between the data bits and the clock signal, and a control signal generator configured to generate a data delay control signal based on the phase difference detected by the phase detector, the data delay control signal controlling the data delay pipe to delay the data bits by the first amount.

3. The apparatus of claim 1, further comprising a phase error correction mechanism coupled to receive the delayed data bits from the data delay pipe and the delayed clock signal from the clock delay pipe, and configured to control the clock delay pipe to delay the clock signal by the second amount.

4. The apparatus of claim 3, wherein the phase error correction mechanism includes a phase detector coupled to receive the delayed data bits from the data delay pipe and the delayed clock signal from the clock delay pipe, and configured to detect a difference in phase between the delayed data bits and the delayed clock signal, and a control signal generator configured to generate a clock delay control signal based on the phase difference detected by the phase detector, the clock delay control signal controlling the clock delay pipe to delay the clock signal by the second amount.

5. A method for recovering data bits of a data stream with reduced phase error, comprising the steps of:

receiving the data stream;

generating a clock signal;

delaying the data bits by a first amount;

generating a data delay control signal for controlling the data bits delaying step to delay the data bits by the first amount;

delaying the clock signal by a second amount; and sampling the delayed data bits using the delayed clock signal to recover the data bits from the data stream with reduced phase error.

6. The method of claim 5, wherein the data delay control signal generating step includes the substeps of detecting a difference in phase between the data bits and the clock signal, and generating the data delay control signal based on the detected phase difference.

7. The method of claim 5, further comprising the step of generating a clock delay control signal for controlling the clock signal delaying step to delay the clock signal by the second amount.

8. The method of claim 7, wherein the clock delay control signal generating step includes the substeps of detecting a difference in phase between the delayed data bits and the delayed clock signal, and generating the clock delay control signal based on the detected phased difference.

9. A receiver to recover data bits from a received data stream, comprising:

a clock generator configured to generate a clock signal;

a phase lock mechanism configured to perform lower bandwidth tracking to align a phase of the data bits to a phase of the clock signal;

a data delay pipe configured to delay the data bits by a first amount in response to the lower bandwidth tracking by the phase lock mechanism;

a phase error correction mechanism configured to perform higher bandwidth tracking to compensate for a remaining difference in phase between the data bits and the clock signal after the lower bandwidth tracking by the phase lock mechanism; and a data sampling element configured to capture the data bits using the clock signal after the higher bandwidth tracking by the phase error correction mechanism.

10. The receiver of claim 9, wherein the phase lock mechanism includes a phase detector coupled to receive the data bits and the clock signal, and configured to detect a difference in phase between the data bits and the clock signal, and a control signal generator configured to generate a data delay signal based on the phase difference detected by the phase detector, the data delay signal controlling the data delay pipe to delay the data bits by the first amount.

11. The receiver of claim 9, further comprising a clock delay pipe configured to delay the clock signal by a second amount in response to the higher bandwidth tracking by the phase error correction mechanism.

12. The receiver of claim 11, wherein the phase error correction mechanism includes a phase detector coupled to receive the delayed data bits from the data delay pipe and the delayed clock signal from the clock delay pipe, and configured to detect a difference in phase between the delayed data bits and the delayed clock signal, and a control signal generator configured to generate a clock delay signal based on the phase difference detected by the phase detector, the clock delay signal controlling the clock delay pipe to delay the clock signal by the second amount.

13. The receiver of claim 11, wherein the data sampling element includes a receiving element configured to receive the delayed data bits and the delayed clock signal, and a sampling element configured to sample the delayed data bits using the delayed clock signal to recover the data bits from the received data stream.

14. A method to recover data bits from a data stream, comprising the steps of:

receiving the data bits of the data stream;

generating a clock signal;

performing lower bandwidth tracking to align a phase of the data bits to a phase of the clock signal;

delaying the data bits by a first amount in response to the lower bandwidth tracking performing step:

performing higher bandwidth tracking to compensate for a remaining difference in phase between the data bits and the clock signal after performing the lower bandwidth tracking; and capturing the data bits using the clock signal after performing the higher bandwidth tracking.

15. The method of claim 14, wherein the lower bandwidth tracking performing step includes the substeps of detecting a difference in phase between the data bits and the clock signal, and generating a data delay signal based on the detected phase difference to control the delaying step to delay the data bits by the first amount.

16. The method of claim 14, further comprising the step of delaying the clock signal by a second amount in response to the higher bandwidth tracking performing step.

17. The method of claim 16, wherein the higher bandwidth tracking performing step includes the substeps of detecting a difference in phase between the delayed data bits and the delayed clock signal, and generating a clock delay signal based on the detected phase difference to control the delaying step to delay the clock signal by the second amount.

18. The method of claim 16, wherein the capturing step includes the substeps of receiving the delayed data bits and the delayed clock signal, and sampling the delayed data bits using the delayed clock signal to recover the data bits from the received data stream.

* * * * *

UNITED STATES PATENT AND TRADEMARK OFFICE
CERTIFICATE OF CORRECTION

PATENT NO. : 5,963,606
DATED : October 5, 1999
INVENTOR(S) : DROST et al.

It is certified that error appears in the above-identified patent and that said Letters Patent is hereby corrected as shown below:

In claim 14, col. 8, line 56, "step:" should read --step;--.

Signed and Sealed this

Fifteenth Day of August, 2000

Attest:

Q. TODD DICKINSON

Attesting Officer      Director of Patents and Trademarks